United States Patent
Zhuang (10) Patent No.: US 7,880,283 B2
(45) Date of Patent: Feb. 1, 2011

(54) HIGH RELIABILITY POWER MODULE

(75) Inventor: Weidong Zhuang, Worcester, MA (US)

(73) Assignee: International Rectifier Corporation, El Segundo, CA (US)

( * ) Notice: Subject to any disclaimer, the term of this patent is extended or adjusted under 35 U.S.C. 154(b) by 53 days.

(21) Appl. No.: 11/789,164

(22) Filed: Apr. 24, 2007

(65) Prior Publication Data

US 2007/0246812 A1   Oct. 25, 2007

Related U.S. Application Data (60) Provisional application No. 60/794,677, filed on Apr. 25, 2006.

(51) Int. Cl.
- *H01L 23/02* (2006.01)
- *H01L 23/498* (2006.01)
- *H01L 23/16* (2006.01)
- *H01L 23/52* (2006.01)
- *H01L 23/047* (2006.01)
- *H01L 23/34* (2006.01)
- *H01L 31/111* (2006.01)
- *H01R 9/00* (2006.01)

(52) U.S. Cl. .............. 257/678; 257/E23.185; 257/E23.189; 257/E23.19; 257/E23.193; 257/E23.106; 257/E23.114; 257/E25.015; 257/E25.016; 257/E23.078; 257/E23.135; 257/E23.066; 257/177; 257/710; 257/704; 257/659; 257/692; 257/712; 257/685; 257/723; 361/823; 361/434; 361/708; 361/714; 361/707

(58) Field of Classification Search ............... 257/714, 257/699, 666, 787, 676, 696, 692, 693, 723, 257/724, 773, 685, 686, 691, 777, 704, 710, 257/707, 678, 659, 700, 668, 712, 177, E23.185, 257/E23.189, E23.19, E23.193, E12.106, 257/E23.114, E25.015, E25.016, E25.051, 257/E23.135, E23.078, E23.066, E23.199; 361/600, 707, 708, 789, 714, 823, 434
See application file for complete search history.

(56) References Cited

U.S. PATENT DOCUMENTS

| | | | |
|---|---|---|---|
| 5,767,576 A * | 6/1998 | Kobayashi et al. | 257/701 |
| 6,060,795 A * | 5/2000 | Azotea et al. | 307/150 |
| 6,384,492 B1 | 5/2002 | Iversen et al. | |
| 6,762,927 B2 * | 7/2004 | Schnitter et al. | 361/508 |
| 6,844,621 B2 * | 1/2005 | Morozumi et al. | 257/700 |
| 6,900,986 B2 * | 5/2005 | Kimoto et al. | 361/704 |
| 7,239,222 B2 * | 7/2007 | Nagaishi et al. | 333/247 |
| 7,453,708 B2 * | 11/2008 | Doiron et al. | 361/823 |
| 7,458,705 B2 * | 12/2008 | Chiba et al. | 362/362 |
| 7,479,693 B2 * | 1/2009 | Kondou et al. | 257/691 |
| 7,492,594 B2 * | 2/2009 | Pal | 361/699 |
| 2001/0028197 A1 * | 10/2001 | Yamane et al. | 307/10.1 |
| 2002/0047132 A1 * | 4/2002 | Fukada et al. | 257/114 |
| 2003/0011057 A1 * | 1/2003 | Nakajima et al. | 257/678 |
| 2004/0089934 A1 * | 5/2004 | Shimoida et al. | 257/686 |

(Continued)

OTHER PUBLICATIONS

International Search Report dated Feb. 26, 2008 issued in PCT Application No. PCT/US07/10137.

*Primary Examiner*—Alexander O Williams
(74) *Attorney, Agent, or Firm*—Farjami & Farjami LLP (57) ABSTRACT

A high reliability power module which includes a plurality of hermetically sealed packages each having electrical terminals formed from an alloy of tungsten copper and brazed onto a surface of a ceramic substrate.

14 Claims, 8 Drawing Sheets

U.S. PATENT DOCUMENTS

| | | | |
|---|---|---|---|
| 2004/0095729 A1* | 5/2004 | Vaysse et al. | 361/710 |
| 2005/0111798 A1* | 5/2005 | Doiron et al. | 385/94 |
| 2005/0167789 A1* | 8/2005 | Zhuang | 257/659 |
| 2006/0043550 A1* | 3/2006 | Zhuang | 257/678 |
| 2006/0244116 A1* | 11/2006 | Tsunoda | 257/678 |
| 2006/0274561 A1* | 12/2006 | Ahmed et al. | 363/132 |
| 2007/0080360 A1* | 4/2007 | Mirsky et al. | 257/99 |
| 2007/0138651 A1* | 6/2007 | Hauenstein | 257/782 |
| 2007/0158778 A1* | 7/2007 | Kitabatake et al. | 257/493 |
| 2007/0193763 A1* | 8/2007 | Parkhill et al. | 174/32 |
| 2008/0101032 A1* | 5/2008 | Tschirbs et al. | 361/719 |

* cited by examiner

HIGH RELIABILITY POWER MODULE

RELATED APPLICATION

This application is based on and claims the benefit of U.S. Provisional Application Ser. No. 60/794,677, filed Apr. 25, 2006, entitled Hermetic IGBT Power Module, to which a claim of priority is hereby made and the disclosure of which is incorporated by reference.

FIELD OF INVENTION

The present invention relates to power modules and more particularly to high reliability power modules.

BACKGROUND OF THE INVENTION

A high reliability semiconductor package typically includes a semiconductor device which is hermetically sealed in a housing portion thereof. Typical semiconductor devices used in high reliability semiconductor packages are power MOSFETs, bipolar transistors, Schottky diodes, PN junction diodes, and IGBTs.

Hermetic surface mount packages, leadless chip carriers and ceramic leadless chip carriers (also known as LCC and CLCC respectively) have served as high reliability platforms for more than 20 years.

In the recent years, a vast array of electronic designs have been integrating new surface mount packages (also referred to as surface mounted devices or SMDs) which have surface mountable terminals on a common surface thereof. Such SMDs are desirable due to their smaller size and footprint, lighter weight, and excellent thermal performance. In addition, many high frequency circuit designs benefit from the inherently low inductance and low resistance of such SMDs.

U.S. patent application Ser. No. 11/044,933, assigned to the assignee of the present application and incorporated by reference, discloses a hermetically sealed package which includes a substrate having an opening therein, a power semiconductor switch disposed within the opening, four terminals brazed onto one major surface of the substrate near the mouth of the opening on the first surface of the substrate, another terminal attached to a second opposing major surface of the substrate and hermetically closing the mouth of the opening at the second surface of the substrate, and a cover hermetically closing the mouth of the opening at the first surface of the substrate. The terminal on the second surface of the substrate serves as an electrical terminal and a thermal path for the heat that is generated by the power semiconductor device.

The terminals are formed from an alloy of tungsten and copper. The low electrical resistivity and thermal properties of tungsten copper impart desirable characteristics to the package. Specifically, the low electrical resistivity of a tungsten copper alloy allows for higher current handling and thus lower power dissipation, and its coefficient of thermal expansion improves the reliability of the package, making it suitable for high reliability applications.

U.S. patent application No. Ser. No. 11/042,986, assigned to the assignee of the present application and incorporated by reference, discloses another hermetically sealed semiconductor package suitable for use in a power module according to the present application.

SUMMARY OF THE INVENTION

A power module according the present invention includes a base plate and a plurality of hermetically sealed packages arranged to form the power stage of a power circuit. In the preferred embodiment, for example, a plurality of hermetically sealed power packages such as the ones described above are arranged to form a half-bridge.

A power module according to the present invention includes the following advantages:

The module design is much more flexible by using the hermetically sealed packages as building blocks.

Cost can be reduced when modules with different configurations are designed with the same building blocks and power terminals.

High power can be easily achieved by paralleling building blocks; whereas, for a single cavity hermetic module, power level is severely limited due to the extreme difficulties in making hermetic and reliable high current feed throughs. Because of this, hermetic power modules with current rating above 450 Amp can rarely be found.

For high reliability applications, building blocks can be pre-screened prior to module construction, which is a critical step for high yield at module level.

A module with a lower profile (height) than the industry standard can be devised, whereby more power density can be achieved.

Other features and advantages of the present invention will become apparent from the following description which refers to the accompanying drawings.

DETAILED DESCRIPTION OF THE FIGURES

Figure 1:
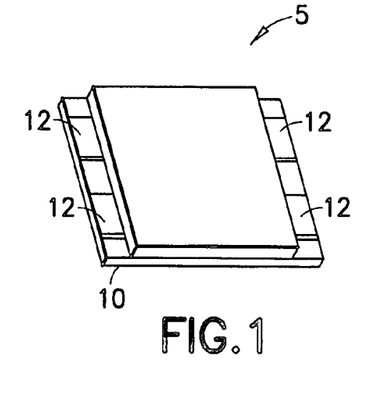
FIG. 1 shows a perspective top view of a package used in a power module according to the present invention.
Figure 2:
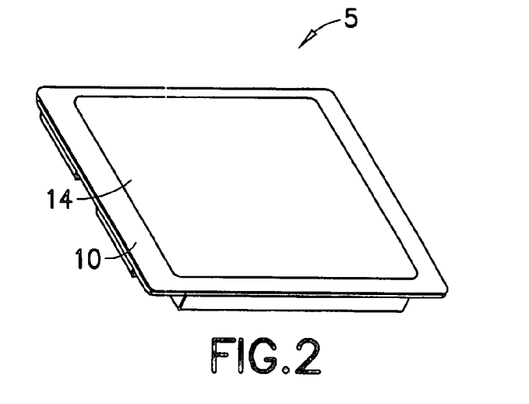
FIG. 2 shows a perspective bottom view of the package of FIG. 1.
Figure 3:
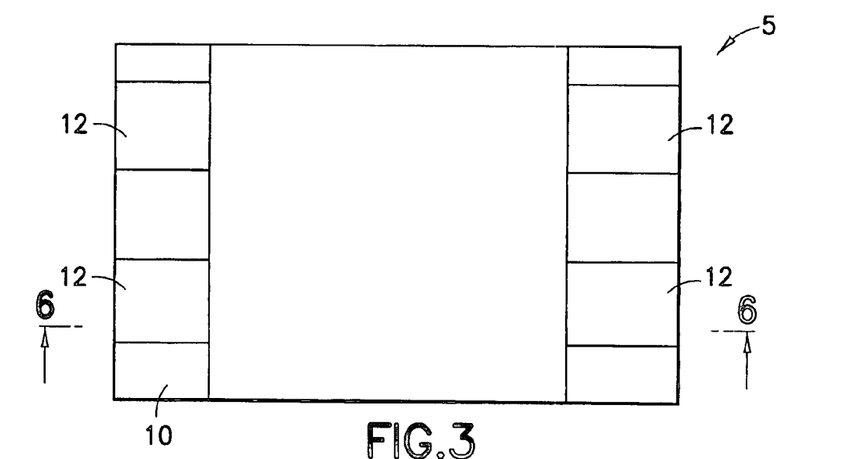
FIG. 3 is a top plan view of the package of FIG. 1.
Figure 4:
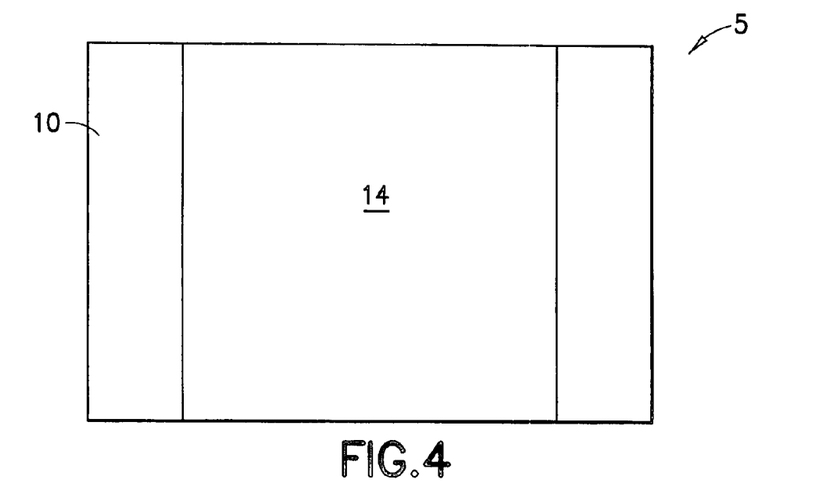
FIG. 4 is a bottom plan view of the package of FIG. 1.

Referring to FIGS. 1-4, a semiconductor package 5 used in a power module according to the present invention includes a substrate 10 having a first terminal 12 on a first major surface thereof, and another second electrical terminal 14 on another opposing major surface thereof. As seen in FIGS. 1 and 3, the package may include three other first electrical terminals 12 on the first major surface of substrate 10. As a result, the package is a five terminal package. It should be noted that a package used in a module according to the present invention is not required to have five terminals, and that fewer or more terminals may be included without deviating from the scope and the spirit of the present invention.

Figure 5:
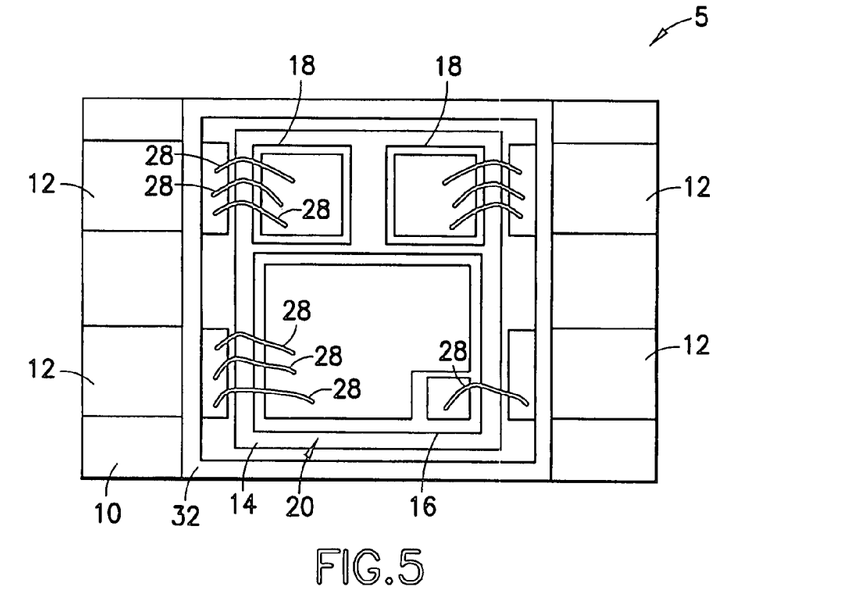
FIG. 5 shows a top plan view of the package of FIG. 1 with its lid removed to illustrate the interior arrangement thereof.

Referring now to FIG. 5, a package used in a module according to the present invention includes a semiconductor power switch 16, and power diodes 18. Power switch 16 and diodes 18 are electrically and mechanically attached to second terminal 14 which is accessible through an opening 20 in substrate 10.

In the preferred embodiment of the present invention, power switch 16 in each package used in a module according to the present invention may be an IGBT. However, a power MOSFET or any other power semiconductor device may be used without deviating from the scope and spirit of the present invention. In addition, in the preferred embodiment, diodes 18 are Schottky diodes. At least one of the Schottky diodes can be parallel connected with the IGBT and serve as a free-wheeling diode, thus rendering the package suitable for power applications.

Figure 6:
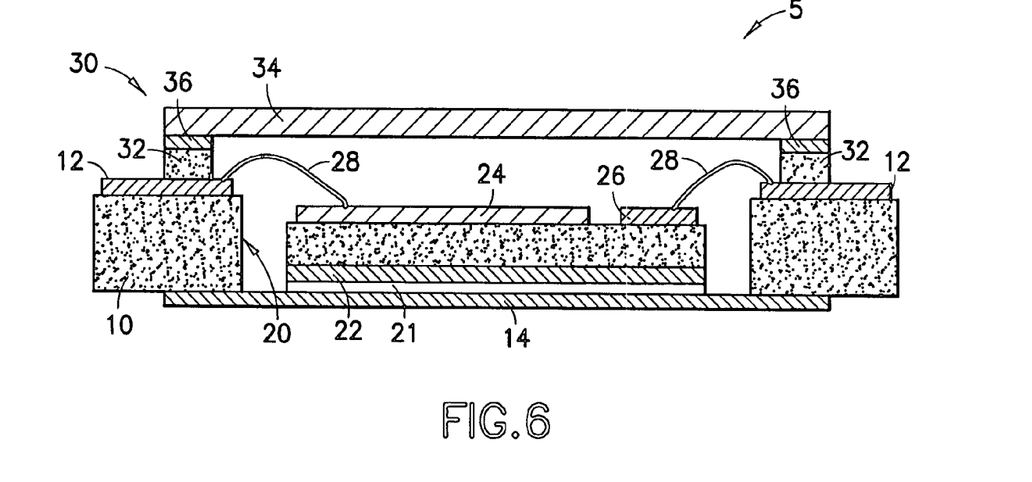
FIG. 6 is a cross-section of the package of FIG. 1 along line 6-6 and viewed in the direction of the arrows.

Referring now to FIG. 6, power switch 16 includes a first power electrode 22 which is electrically and mechanically connected to second terminal 14 by a layer of conductive adhesive material 21 such as solder. Power switch 16 further includes a second power electrode 24 which is positioned opposite to first power electrode 22, and control electrode 26, which is also positioned opposite first power electrode 22.

In the preferred embodiment, in which an IGBT is used, first power electrode 22 is the collector contact, second power electrode 24 is the emitter contact, and control electrode 26 is the gate contact. Preferably, second power electrode 24 and control electrode 26 can be connected electrically to respective first terminals 12 on the first major surface of substrate 10 by wire bonds 28 or the like. The package is not restricted to the use of wire bonds. However, conductive clips, straps or the like may also be used without deviating form the scope and spirit of the present invention.

Although not shown specifically, diodes 18 are connected to respective electrical terminals in a similar manner. Specifically, the cathode of each diode 18 may be electrically and mechanically connected by a conductive adhesive such as solder to second terminal 14, while its anode electrode may be electrically connected to a respective first terminal 12 by wire bonds 28 or the like.

The package may further include cover 30 which encloses power semiconductor switching device 16 and power diodes 18 within opening 20 in substrate 10.

Opening 20 in substrate 10 is preferably hermetically sealed. Specifically, second terminal 14 is selected to have a larger area than the mouth of opening 20 at the second major surface of substrate 10 such that when placed thereon its periphery will be disposed on a portion of the second major surface of substrate 10 whereby the mouth of opening 20 at the second major surface of substrate 10 is closed. To render the mouth of opening 20 at the second major surface of substrate 10 hermetically sealed, second terminal 14 may be hermetically attached to the second major surface of substrate 10 at the periphery thereof by any known method such as brazing or the like.

Furthermore, cover 30 is hermetically attached to the first major surface of substrate 10 to hermetically seal the devices contained within opening 20. Specifically, cover 30 includes enclosure 32 which is disposed around the mouth of opening 20 at the first major surface of substrate 10 and hermetically connected to the same. As seen in FIGS. 5 and 6, the dimensions of enclosure 32 are selected such that a portion of each first terminal 12 is disposed within enclosure 32 to receive wire bonds 28, and a portion of each terminal is outside of enclosure 32 and is available for external connection.

Cover 30 further includes lid 34, which is hermetically attached to enclosure 32 by hermetic seal 36. As a result, cover 30 hermetically closes the mouth of opening 20 at the first major surface of substrate 10, and thus power semiconductor switching device 16, and power diodes 18 are contained within a hermetically sealed compartment created by opening 20, second terminal 14 and cover 30.

First terminals 12, and second terminal 14 are preferably composed of an alloy of tungsten copper. For example, a tungsten copper alloy in which about 80% of the total weight is tungsten and about 20% of the total weight is copper can be used to form terminals 12, 14. Alternatively, a tungsten copper alloy in which about 85% of the total weight is tungsten and about 15% of the total weight is copper is used to form terminals 12, 14. The term about as used herein is meant to indicate that the amount of copper may vary from 0% to 25% without compromising the beneficial characteristics of the alloy.

Preferably, enclosure 32 is composed of a ceramic such as alumina, substrate 10 is composed of a ceramic such as alumina, lid 34 is composed of Kovar or Alloy 42, and hermetic seal 36 is composed of a conventional gold-tin alloy in which preferably about 80% of the total weight is gold and about 20% of the total weight is tin.

Also, preferably, conductive adhesive 21 is composed of a lead-based solder.

To manufacture a package for use in a power module according to the present invention, preferably, substrate 10 is slip cast, and dried. Thereafter, opening 20 is formed in substrate 10 by punching or the like. Next, Mo—Mn or W is metallized onto areas of substrate 10 that are to receive terminals 12, 14, and substrate 10 and the metallizations are co-fired. The, terminals 12, 14 are attached to substrate 10 by brazing or the like, and, thereafter, preferably plated with nickel or gold. Power switch 16 and diodes 18 are then soldered in place, and cover 30 is installed.

Table 1 sets forth a comparison of a package 5 used in a power module according to the present invention to prior art surface mounted devices.

TABLE I

| Package Type | Package Outline (in) | Cavity Size (in) | Cavity/Outline Area Ratio | Overall Height (in) |
|---|---|---|---|---|
| SMD0.5 | 0.400" × 0.300" | 0.203" × 0.168" | 0.284 | 0.123" |
| SMD1 | 0.625" × 0.450" | 0.338" × 0.338" | 0.406 | 0.141" |
| SMD2 | 0.690" × 0.525" | 0.403" × 0.403" | 0.448 | 0.141" |
| SMD3 | 0.775" × 0.500" | 0.395" × 0.293" | 0.298 | 0.141" |
| Embodiment of Invention | 1.180" × 1.030" | 0.910" × 0.620" | 0.464 | 0.150" |

When a size 8.8 IGBT such as IRG4CC88KB (available from International Rectifier) is used in a package according to the present invention, the following may be observed (assume pb-based solder for conductive adhesive which is 0.003" thick):

The IGBT is dissipating 500 W.

The Base temperature is at 70° C.

Junction temperature rise is 21° C.

Junction to base thermal resistance is about 0.042° C./W (ideal die attach, 0% void).

When power Schottky diodes (0.170"×0.170"×0.015") such as HF50D060ACE (available from International Rectifier) are used, the following may be observed (assume pb-based solder for the conductive adhesive which is 0.003" thick):

Each diode dissipates 250 W.

Base temperature is at 70° C.

Junction temperature rise is 46.5° C.

Junction to base thermal resistance is about 0.19° C./W (ideal die attach, 0% void).

In the package described above, when 200 Amps (DC) is passing through a single first terminal 12, the terminal only dissipates about 3.5 W due to ohmic heating when the package base is at 25° C. Also, the peak temperature rise is about 6° C.

Also, the thermal spreading is efficient due to having terminals which are bonded to the substrate.

At high frequency switching the skin effect must be considered. The skin effect can be taken into account with the following formula:

$$X = 2\pi a (2*f*\mu/\rho)^{1/2}$$

x: skin effect ratio
a: radius of conductor in centimeters
f: frequency in cycles per second
$\mu$: magnetic permeability of conductor
$\rho$: resistivity in nano-ohms centimeter In the package described above, at switching frequency of 20 kHz, the skin effect ratio has been calculated to be about 4.9 for a terminal composed of an alloy containing tungsten (about 80% of total weight) and copper (about 20% of the total weight). Thus, it has been observed that the effective resistance of the terminal is doubled at 20 kHz as compared to its resistance at DC. This is much better than standard copper-cored alloy 52 leads used in prior art hermetic packages. Thus, at 200 Amps the temperature rise of a terminal may be as much as 11.7° C.

A power module according to the present invention includes a plurality of hermetically sealed semiconductor packages arranged to form a power semiconductor circuit.

According to the preferred embodiment of the present invention, a plurality of hermetically sealed semiconductor packages are arranged on a common support baseplate to form a half-bridge circuit. Thus, for example, as described below, six semiconductor packages 5 as described above are arranged on a common baseplate to obtain a high reliability power module.

Figure 7:
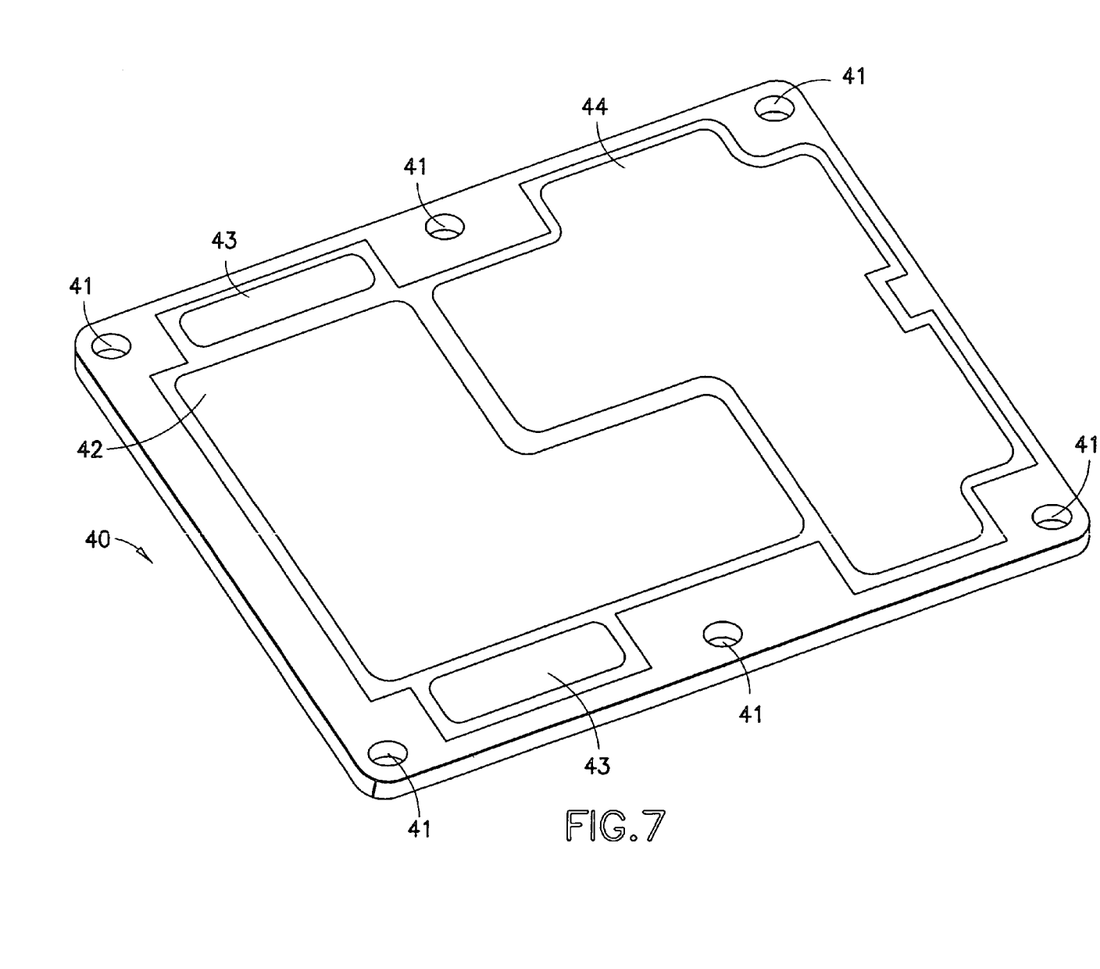
FIG. 7 shows a base plate used in a power module according to the present invention.

FIG. 7 illustrates a common baseplate 40 for use in a power module according to the present invention. Common baseplate 40 includes a first conductive pad 42, a second conductive pad 44 (spaced and separated from pad 42) and third conductive pads 43 (each spaced and separated from pad 42 but disposed at an edge thereof) all disposed on a surface of an insulation support body. Thus, for example, pads 42, 44, 43 may be copper bodies or the like. Note, that to make the most efficient use of the area pads 42, 44 are generally L-shaped.

Baseplate 40 is of a material which has good thermal conductivity, a thermal coefficient of expansion which is compatible with packages to be disposed thereon, and also compatible with a cover to be sealed to the baseplate. The baseplate may be made of a laminate or composite of metallic materials in a combination to achieve the requisite thermal conductivity and thermal coefficient of expansion. The metallic materials typically include copper, copper tungsten, copper molybdenum, copper alloys or aluminum silicone carbide. Note that baseplate 40 includes a plurality of through holes 41 which can be used for mounting of the power module on, for example, a heatsink.

Figure 8:
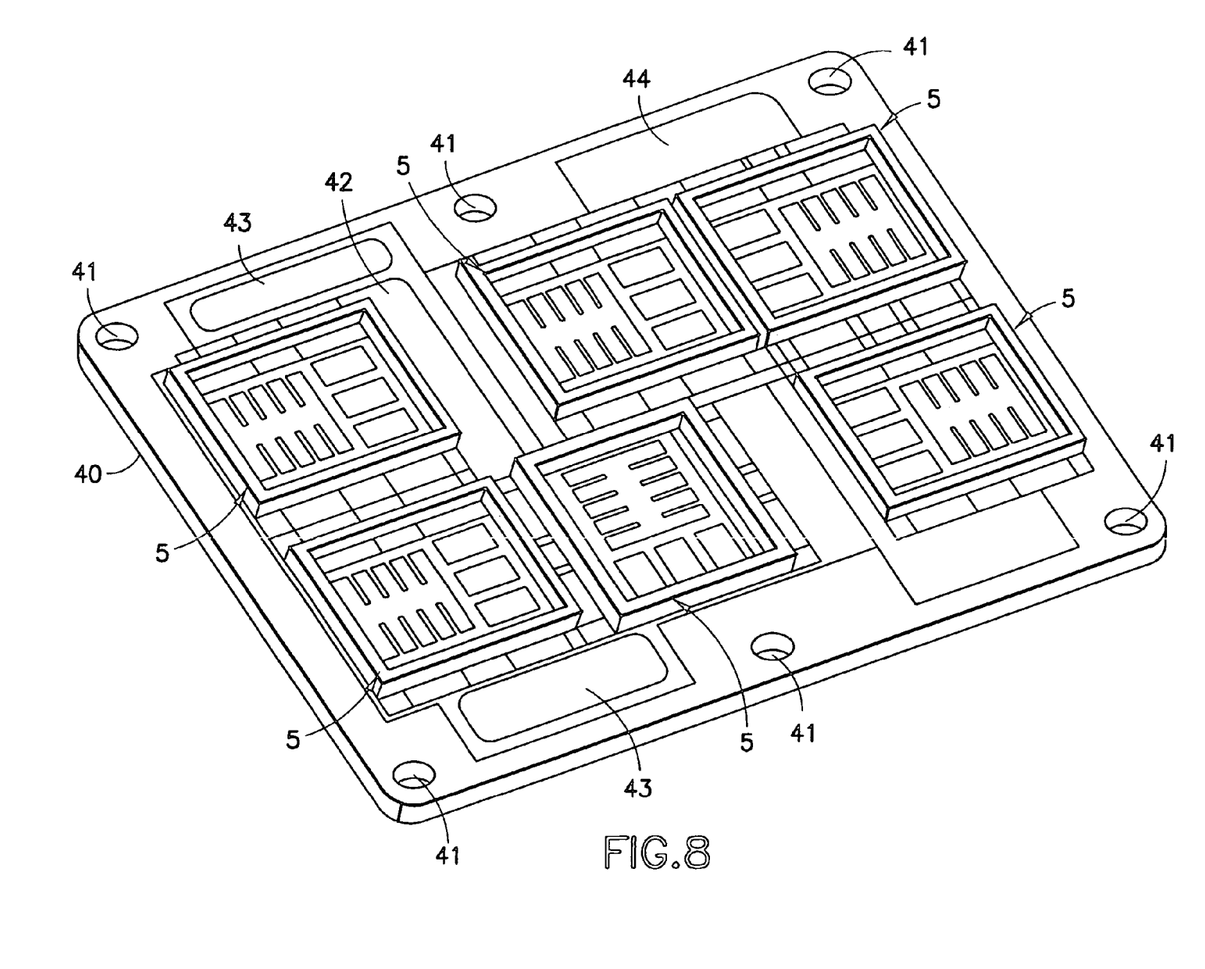
FIG. 8 shows the base plate after receiving hermetically sealed packages according to the present invention.

Referring next to FIG. 8, six packages 5 as described, each including an IGBT as the switch contained therein, are arranged on common baseplate 40. Specifically, bottom terminal 14 of three packages are electrically and mechanically connected using solder, brazing, or the like conductive adhesive to pad 42, and bottom terminal 14 of the other three packages are electrically and mechanically connected to pad 44 using solder, brazing, or the like conductive adhesive.

Figure 9:
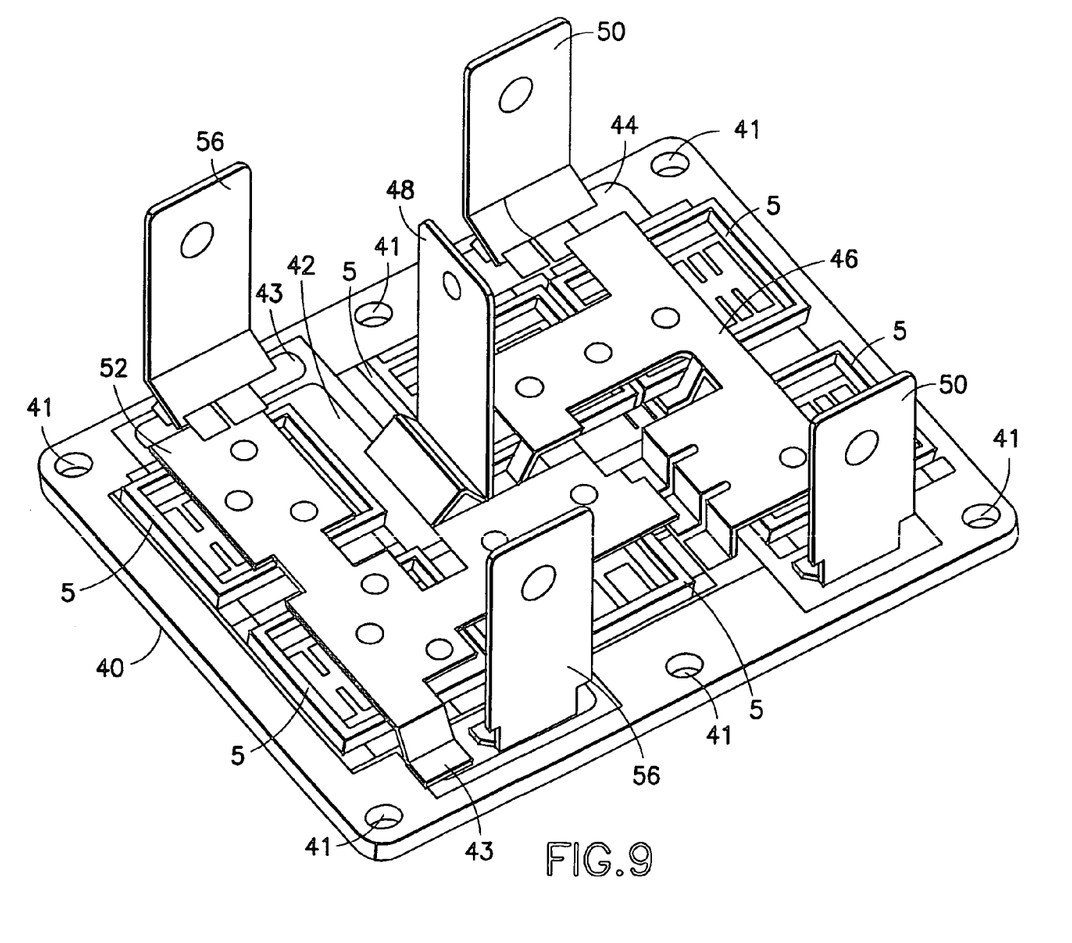
FIG. 9 shows the arrangement of FIG. 8 after receiving stress relieved copper buses according to the present invention.

Referring next to FIG. 9, a number of stress-relieved three dimensional copper buses are used for internal connection and external connection to obtain a half-bridge arrangement that includes three parallel connected half-bridge circuits. Specifically, copper bus 46 connects pad 42, which is connected electrically to bottom terminals 14 of three packages 5 (and thus to the collector electrodes of the IGBTs contained therein), to terminal(s) 12 of packages 5 on pad 44 so that the emitter electrodes of the IGBTs in packages 5 on pad 44 are electrically connected to the collector electrodes of the IGBTs in packages 5 disposed on pad 42. Copper bus 46 includes lead 48, which may serve as the lead to the switched node of the half-bridges.

Preferably, two copper leads 50 are electrically and mechanically connected to pad 44 and serve as the leads to the collector electrodes of the IGBTs in packages 5 disposed on pad 44. An internal copper bus 52 electrically connects terminals 12 of the packages 5 on pad 42 that are connected to the emitter electrodes of the IGBTs contained therein. Copper bus 52 is then connected to conductive pads 43. A copper lead 56 is electrically and mechanically connected to each conductive pad 43 and serves as a lead to emitter electrodes of the IGBTs contained in the packages 5 disposed on pad 42.

Figure 10:
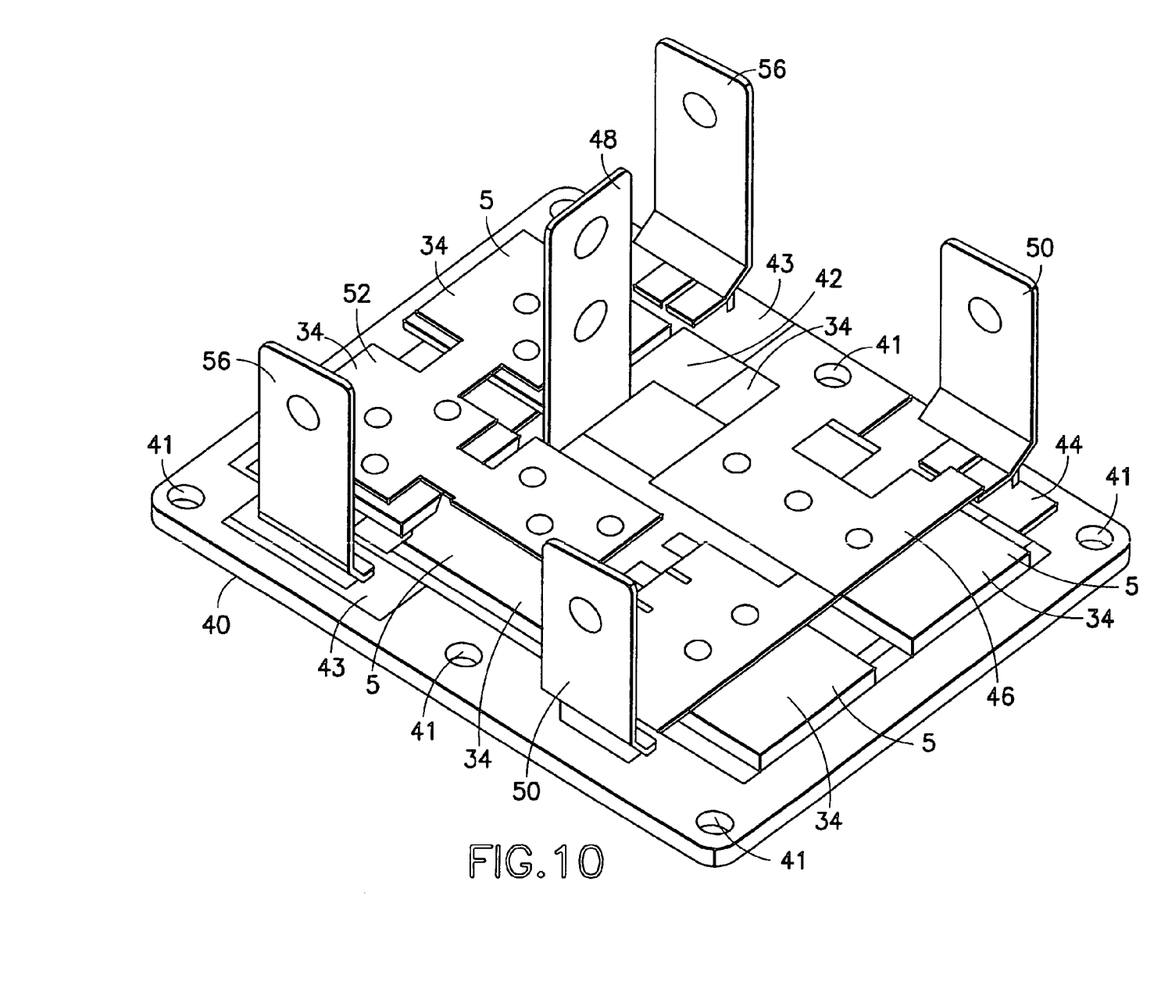
FIG. 10 shows the arrangement of FIG. 9 after the packages have been hermetically sealed.

Referring next to FIG. 10, each package in a power module according to the present invention may be finished when each package is hermetically sealed (in the manner described above), either before or after the installation thereof on common baseplate 40. Thus, a power module as illustrated by FIG. 10 can be used in a fluid cooled environment.

Figure 11:
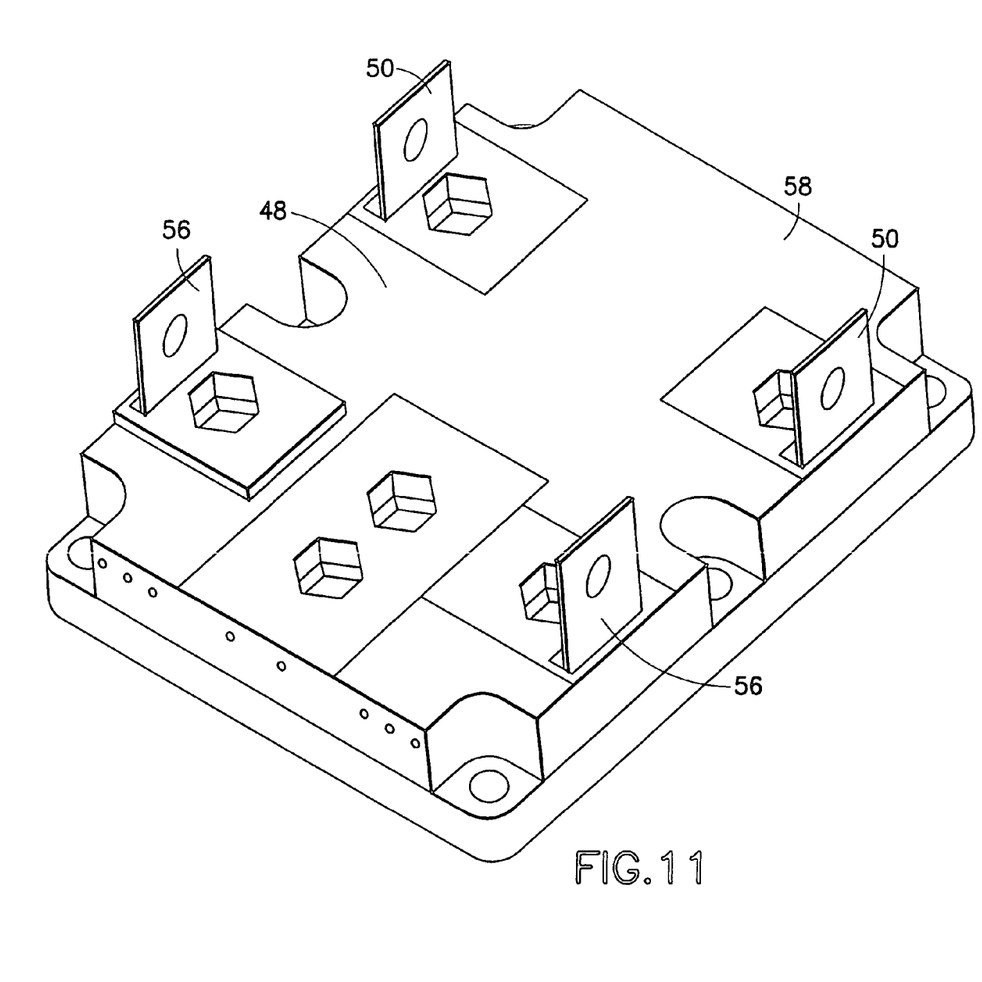
FIG. 11 shows a power module according to the present invention after receiving a plastic enclosure.

Referring now to FIG. 11, a plastic cover 58 may be installed over the module shown by FIG. 10 and preferably sealed to baseplate 40 to facilitate power terminal connection and vibration ruggedness. Thus, as illustrated leads 48, 50, 56 extend from the top surface of plastic cover 58.

Figure 12:
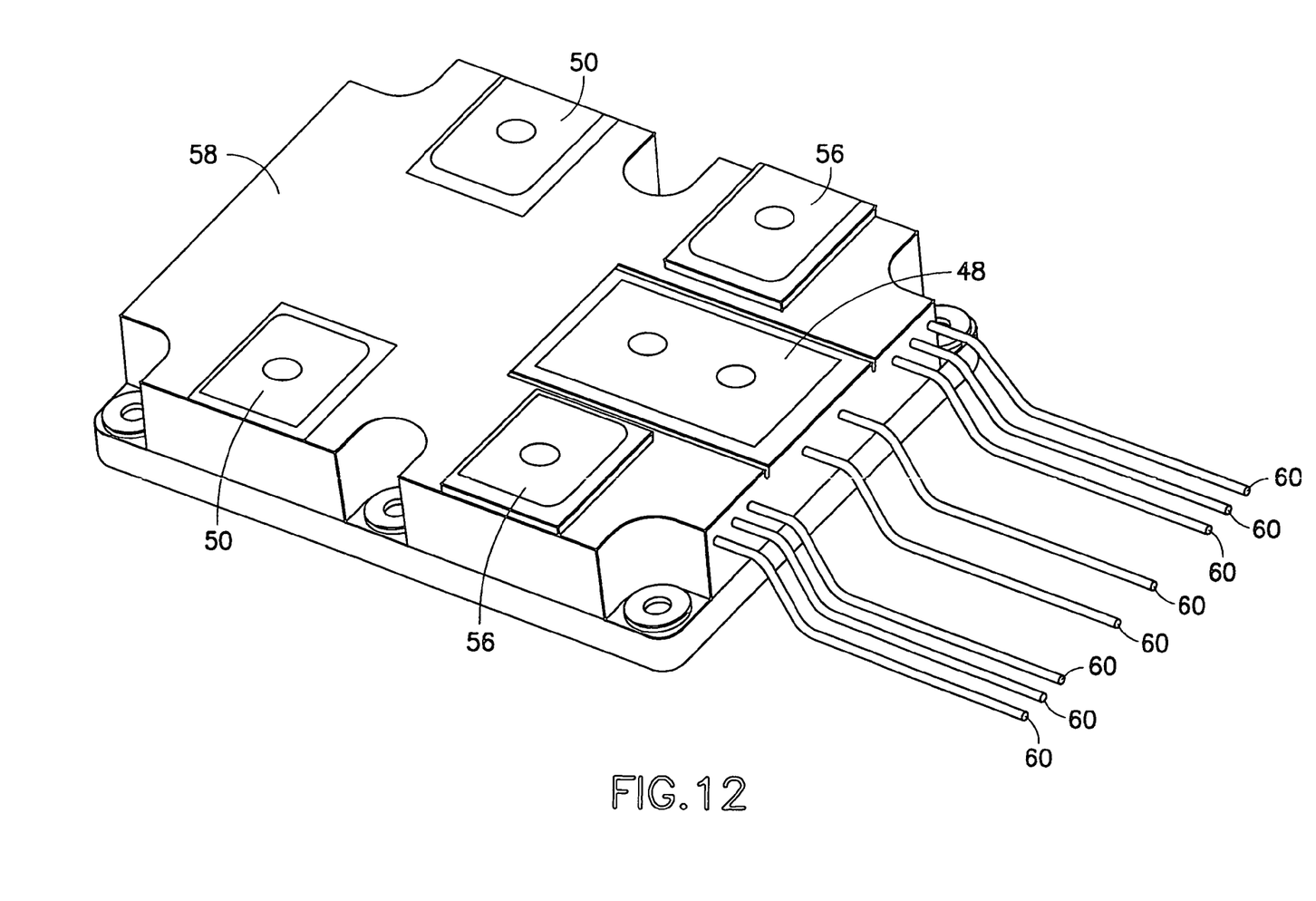
FIG. 12 shows a finished power module according to the present invention.

Note that although not specifically discussed herein, it is to be understood that the gate electrodes of the IGBTs of the packages must be connected to external drive circuitry. Thus, as illustrated by FIG. 12, leads 60 are provided, each for electrical connection to a respective terminal 12 of a package that is connected to a respective gate electrode of an IGBT. Note that leads 48, 50, 56 can be bent down over the exterior surface of plastic housing 58 to further reduce the profile of the package.

A power module according to the preferred embodiment as described above can include packages for forming a 600V, 800 Amp half-bridge IGBT module with six total hermetically sealed power semiconductor packages each serving as a building block, in which three packages are parallel connected to serve as the high side of the bridge and the other three are parallel connected to serve as the low side of the half bridge as can be discerned from the figures and the description set forth above. The footprint of the package can be about 3.6"×4.5", and the height of the package can be as low as 0.8".

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor module comprising:
 a base plate;
 a plurality of individually hermetically sealed power semiconductor packages arranged on said base plate;

a plurality of stress relieved buses interconnecting said packages electrically to form a power stage of a power circuit;

a cover; and a plurality of stress relieved leads connected to said power stage and extending through said cover.

2. The power semiconductor module of claim 1, wherein said power stage is a half-bridge.

3. The power semiconductor module of claim 1, wherein each power semiconductor package includes an IGBT.

4. The power semiconductor module of claim 1, wherein each power semiconductor package includes a substrate, said substrate including a first major surface, and a second major surface opposite said first major surface; a first electrical terminal on said first major surface of said substrate; a second electrical terminal on said second major surface of said substrate; and a semiconductor device having a first electrode electrically connected to said first electrical terminal and a second electrode electrically connected to said second electrical terminal; wherein each power semiconductor package is hermetically sealed by said second electrical terminal and a package cover disposed around said semiconductor device.

5. The power semiconductor module of claim 4, wherein said substrate is comprised of a ceramic material.

6. The power semiconductor module of claim 5, wherein said substrate is comprised of alumina.

7. The power semiconductor module of claim 4, wherein said terminals are comprised of a copper tungsten alloy.

8. The power semiconductor module of claim 4, wherein said alloy substantially consists of 80% tungsten and 20% copper by weight.

9. The power semiconductor module of claim 4, wherein said alloy substantially consists of 85% tungsten by weight and 15% copper by weight.

10. The power semiconductor module of claim 4, wherein said hermetically sealed package cover includes a ceramic enclosure disposed around said semiconductor device and hermetically attached to said substrate, and a lid hermetically attached to said ceramic enclosure.

11. The power semiconductor module of claim 10, further comprising a hermetic seal disposed between said lid and said ceramic enclosure.

12. The power semiconductor module of claim 11, wherein said hermetic seal is comprised of 80% gold and 20% tin by weight.

13. The power semiconductor module of claim 12, wherein said lid is comprised of either Kovar or Alloy 42.

14. The power semiconductor module of claim 4, wherein said first terminal of each package is electrically and mechanically coupled to a conductive pad on said base plate by a conductive adhesive.

* * * * *